(12) United States Patent
Park et al.

(10) Patent No.: US 8,410,373 B2
(45) Date of Patent: Apr. 2, 2013

(54) PRINTED CIRCUIT SUBSTRATE AND METHOD OF MANUFACTURING THE SAME

(75) Inventors: Hyung Wook Park, Suwon-si (KR); Young Chang Joo, Seoul (KR); Hong Seok Min, Yongin-si (KR); Young Gwan Ko, Seoul (KR); Chang Sup Ryu, Yongin-si (KR); Ho Young Lee, Seoul (KR); Shin Bok Lee, Paju-si (KR); Min Suk Jung, Incheon (KR)

(73) Assignees: Samsung Electro-Mechanics Co., Ltd., Suwon (KR); SNU R&DB Foundation, Seoul (KR)

( * ) Notice: Subject to any disclaimer, the term of this patent is extended or adjusted under 35 U.S.C. 154(b) by 303 days.

(21) Appl. No.: 12/801,724

(22) Filed: Jun. 22, 2010

(65) Prior Publication Data

US 2011/0253431 A1 Oct. 20, 2011

(30) Foreign Application Priority Data

Apr. 20, 2010 (KR) ........................ 10-2010-0036452

(51) Int. Cl.
*H05K 1/03* (2006.01)
*H05K 3/36* (2006.01)
(52) U.S. Cl. ......................................... 174/255; 29/830
(58) Field of Classification Search .................. 174/250, 174/255, 261–266, 256–259; 29/830, 840
See application file for complete search history.

(56) References Cited

U.S. PATENT DOCUMENTS 6,713,687 B2 * 3/2004 Yazaki et al. ................. 174/263
6,791,818 B1 * 9/2004 Shimoyama et al. ......... 361/302

FOREIGN PATENT DOCUMENTS

| JP | 2002-265920 | 9/2002 |
| JP | 2003-124591 | 4/2003 |
| JP | 2006-278825 | 10/2008 |
| JP | 2009-32844 | 2/2009 |
| JP | 2009-135097 | 6/2009 |
| KR | 2003-0079745 | 10/2003 |
| KR | 10-0489869 | 5/2005 |

OTHER PUBLICATIONS

Japanese Office Action dated Nov. 15, 2011 issued in corresponding Japanese Patent Application No. 2010-143505.
Korean Office Action dated Nov. 30, 2011 issued in corresponding Korean Patent Application No. 10-2010-0036452.
Korean Office Action dated Apr. 25, 2011 issued in corresponding Korean Patent Application No. 10-2010-0036452.

\* cited by examiner

*Primary Examiner* — Jeremy Norris

(57) ABSTRACT

Disclosed herein are a printed circuit substrate and a method of manufacturing the same. The printed circuit substrate includes an insulating layer, and a circuit layer that includes a circuit pattern disposed on the insulating layer and a barrier layer that is disposed to cover at least one surface of the circuit pattern and suppresses electrochemical migration from the circuit pattern, thereby making it possible to achieve high-density and secure reliability, and the method of manufacturing the same.

7 Claims, 4 Drawing Sheets

PRINTED CIRCUIT SUBSTRATE AND METHOD OF MANUFACTURING THE SAME

CROSS REFERENCE TO RELATED APPLICATION

This application claims the benefit of Korean Patent Application No. 10-2010-0036452, filed on Apr. 20, 2010, entitled "Printed circuit substrate and method of manufacturing the same", which is hereby incorporated by reference in its entirety into this application.

BACKGROUND OF THE INVENTION

1. Technical Field

The present invention relates to a printed circuit substrate and a method of manufacturing the same, and more particularly, to a printed circuit substrate having a barrier layer that suppresses electrochemical migration from a circuit pattern and a method of manufacturing the same.

2. Description of the Related Art

A printed circuit substrate, which serves to electrically connect electronic components to each other, is a core component of electronic equipment. The printed circuit substrate can be applied to electronic equipment used in the external environment, for example, a portable terminal, electronic components of an automobile, industrial equipment, military equipment and so on, such that it may be easily exposed to the external environment.

When the printed circuit substrate is operated, in particular, while being exposed to high-temperature and high-humidity environment, electrochemical migration (hereinafter, referred to as 'ECM') phenomenon is generated, such that it may degrade reliability of the printed circuit substrate. Herein, the electrochemical migration is a phenomenon that when voltage is applied between two metal electrodes that are electrically insulated, together with the absorption of moisture including pollutants, it becomes electrochemically unstable, such that conductive filaments grow between the two metal electrodes to cause an electrical short circuit.

Further, as the electronic components become smaller and lighter and is highly integrated, the line width of the circuit pattern of a printed circuit substrate and the intervals between the circuit patterns are gradually reduced. Therefore, reliability of the printed circuit substrate becomes more problematic due to the ECM.

SUMMARY OF THE INVENTION

Therefore, the present invention is provided to solve the problems that may be generated from a printed circuit substrate and a method of manufacturing the same. More specifically, the present invention has been made in an effort to provide a printed circuit substrate that includes a barrier layer that is disposed on at least one surface of a circuit pattern and suppresses electrochemical migration from the circuit pattern, such that it can prevent an electrical short circuit due to electrochemical migration, thereby making it possible to improve high-density and reliability, and a method of manufacturing the same.

An object of the present invention is to provide a printed circuit substrate. The printed circuit substrate may include an insulating layer; and a circuit layer that includes a circuit pattern disposed on the insulating layer and a barrier layer that is disposed to cover at least one surface of the circuit pattern and suppresses electrochemical migration from the circuit pattern.

Herein, the barrier layer may be made of an inter-metallic compound.

The inter-metallic compound may include any one of Cu—Sn, Cu—Zn, Cu—Sb, Cu—In, Ni—B, Ni—Sn and Ag—Sn.

The barrier layer may further be interposed between the insulating layer and the circuit pattern.

The printed circuit substrate may include a pad that is electrically connected to the circuit layer, and the barrier layer may further be disposed on at least one surface of the pad.

Another object of the present invention is to provide a method of manufacturing a printed circuit substrate. The method of manufacturing the printed circuit substrate may include: forming a circuit pattern on an insulating layer; and forming a barrier layer that suppresses electrochemical migration from the circuit pattern on at least one surface of the circuit pattern.

Herein, the forming the barrier layer may further include: forming an auxiliary barrier layer that is made of metal different from that of the circuit pattern and is formed on at least one surface of the circuit pattern; and annealing between the auxiliary barrier layer and the circuit pattern.

The forming the barrier layer may include: sequentially forming a first auxiliary barrier layer and a second auxiliary barrier layer, that are made of different metals, on one surface of the circuit pattern; and annealing the first and second auxiliary barrier layers.

The barrier layer may be made of an inter-metallic compound.

The barrier layer may include any one of Cu—Sn, Cu—Zn, Cu—Sb, Cu—In, Ni—B, Ni—Sn and Ag—Sn.

The barrier layer may further be interposed between the insulating layer and the circuit pattern.

DESCRIPTION OF THE PREFERRED EMBODIMENTS

Figure 1:
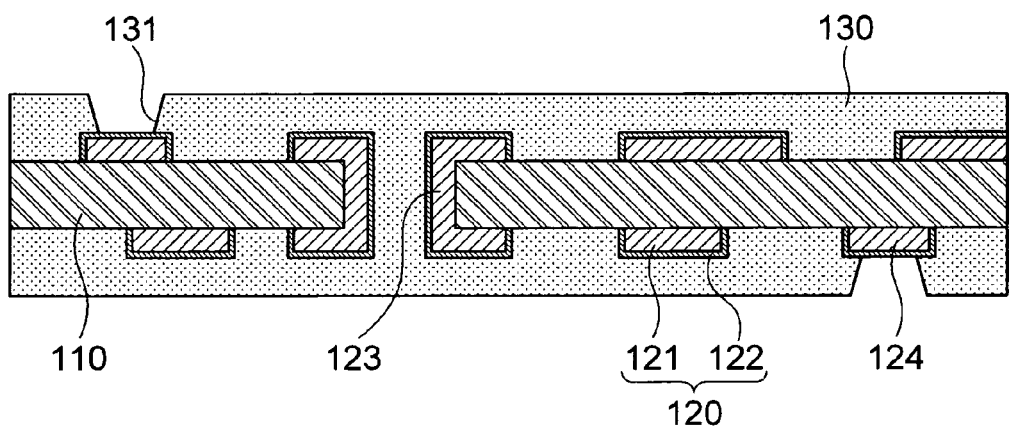
FIG. 1 is a cross-sectional view of a printed circuit substrate according to a first embodiment of the present invention.

Hereinafter, the exemplary embodiments of the present invention will be described in detail with reference to the accompanying drawings of a printed circuit substrate. The exemplary embodiments of the present invention to be described below are provided so that those skilled in the art to which the present invention pertains can fully carry out the present invention. Therefore, the present invention may be modified in many different forms and it should not be limited to the embodiments set forth herein. In the drawings, the size and the thickness of the device may be exaggerated for the convenience. Like reference numerals designate like components throughout the specification.

FIG. 1 is a cross-sectional view of a printed circuit substrate according to a first embodiment of the present invention.

Referring to FIG. 1, the printed circuit substrate according to the first embodiment of the present invention may include a circuit layer 120 that is disposed on a first insulating layer 110.

The first insulating layer 110 may be made of an insulating resin or an insulating resin in which a glass fiber is impregnated. The insulating resin may be, for example, a polyimide based resin, an epoxy based resin, and the like. The insulating layer may have a form of a substrate or a film. However, the material and the form of the insulating layer are not limited in the embodiment of the present invention.

The circuit layer 120 may be disposed on the upper surface and lower surface of the first insulating layer 110, respectively, while forming an interlayer connection through a via 123. Herein, the circuit layer 120 may include circuit patterns 121 made of metal and a barrier layer 122 that cover the circuit patterns 121.

The barrier layer 122 may function as a barrier that suppresses electrochemical migration from the circuit pattern 121. That is, the barrier layer 122 suppresses the movement of metal ions from the circuit pattern 121, thereby making it possible to prevent conductive filaments from growing in the circuit pattern 121.

Therefore, although the line width of the circuit pattern 121 and the intervals between the circuit patterns 121 are reduced, a short circuit between the circuit patterns 121 due to the electrochemical migration can be prevented.

Further, the barrier layer 122 is provided so as to cover the circuit pattern 121, thereby making it possible to prevent the reliability of the printed circuit substrate from being degraded due to a short circuit by the electrochemical migration although the printed circuit substrate is used under an extreme environment with high-temperature and high-humidity. Therefore, the environmental condition does not need to be taken into consideration, thereby making it possible to expand the selection of the use of the printed circuit substrate.

The barrier layer 122 may be made of an inter-metallic compound (IMC) that can suppress the movement of metal ions. For example, the inter-metallic compound may be any one of Cu—Sn, Cu—Zn, Cu—Sb, Cu—In, Ni—B, Ni—Sn and Ag—Sn.

The barrier layer 122 may have a thickness of several tens to several thousands nanometers. For example, the barrier layer 122 may have a thickness of 10 to 1000 nm. At this time, when the barrier layer 122 has a thickness below 10 nm, it cannot function as a barrier that suppresses the electrochemical migration. In contrast, when the barrier layer 122 has a thickness exceeding 1000 nm, there may be a difficulty in applying it to a mass production due to the elongated process time for forming the barrier layer 122 and the fine pitch of the circuit pattern 121 may be retrogressed due to the increased thickness of the barrier layer 122. Herein, if the mass-production or the fine pitch is not required to be taken into consideration, the barrier layer 122 may have a thickness exceeding 1000 nm.

In addition, when the printed circuit substrate is a double-sided printed circuit substrate, it may further include a pad 124 that electrically connects the circuit layer 120 to an external circuit unit. At this time, although not shown in the drawing, the barrier layer 122 is further provided on at least one surface of the pad 124 to suppress the electrochemical migration from the pad 124, thereby making it possible to prevent a short circuit from generating between the pads 124 adjacent to each other.

Further, a second insulating layer 130 may be disposed on the first insulating layer 110 that includes the circuit layer 120. Herein, the second insulating layer 130 may include an opening 131 that exposes the pad 124 connected to the circuit layer 120. At this time, the second insulating layer 130 may be made of a solder resist.

In the present embodiment, the printed circuit substrate is illustrated and described to have one circuit layer on both surfaces of the first insulating layer but it is not limited thereto. For example, the printed circuit substrate may be a multi-layer printed circuit substrate that includes the second insulating layer and the circuit layer that are stacked in plural or a single-layer printed circuit substrate that includes the circuit layer on one surface of the first insulating layer.

Herein, when the printed circuit substrate is the multi-layer printed circuit substrate, the second insulating layer may, for example, be made of a general insulating resin that may be used in a build-up process, but the embodiment of the present invention is not limited thereto.

Further, the barrier layer is described to be included in all of the circuit layers in the embodiment of the present invention but it is not limited thereto. That is, the barrier layer may be selectively included in the circuit layers in partial regions. For example, the barrier layer may be formed to cover only the circuit patterns in circuit regions that are closely disposed.

Therefore, the printed circuit substrate according to the embodiment of the present invention includes the barrier layer that covers the circuit pattern, such that it can suppress the electrochemical migration and prevent a short circuit between the circuit patterns, thereby making it possible to implement the high-density simultaneously with securing the reliability.

In addition, the printed circuit substrate according to the embodiment of the present invention includes the barrier layer, such that it can also be used under the extreme environment with high-temperature and high-humidity, thereby making it possible to enhance the selection of use according to the environmental conditions.

Hereinafter, a printed circuit substrate according to a second embodiment of the present invention will be described with reference to FIG. 2. Herein, the printed circuit substrate according to the second embodiment may have the same technical constitution as that according to the aforementioned first embodiment, except for the form of the barrier layer. Therefore, a description of the second embodiment overlapped with that of the first embodiment will be omitted and the same reference numerals will be used for the same technical constitutions.

Figure 2:
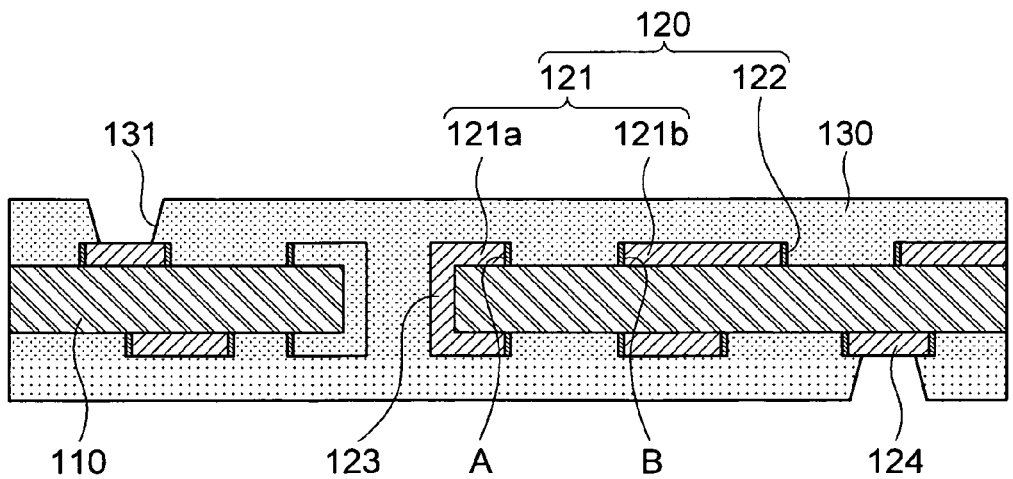
FIG. 2 is a cross-sectional view of a printed circuit substrate according to a second embodiment of the present invention.

FIG. 2 is a cross-sectional view of a printed circuit substrate according to a second embodiment of the present invention.

Referring to FIG. 2, the printed circuit substrate according to the second embodiment of the present invention may include a circuit layer 120 that is disposed on a first insulating layer 110. Herein, the circuit layer 120 may include a circuit pattern 121 and a barrier layer 122 that is disposed on one surface of the circuit pattern 121.

More specifically, the circuit pattern 121 may include first and second circuit patterns 121a and 121b that are adjacent to each other. Herein, the barrier layers 122 may be disposed on the first side surface A of the first circuit pattern 121a and the second side surface B of the second circuit pattern 121b that are opposite to each other, respectively. However, the embodiment of the present invention is not limited thereto and thus, the barrier layer 122 may also be disposed on only any one of the first and second side surfaces A and B.

Therefore, the barrier layer 122 suppresses the movement of metal ions from the side surface of the circuit pattern 121, thereby making it possible to prevent conductive filaments from growing laterally the circuit pattern 121 and thus to prevent a short circuit defects between the first and second circuit patterns 121a and 121b adjacent to each other.

Therefore, as shown in the embodiment of the present invention, the barrier layer is selectively disposed on the side surface of the circuit pattern, thereby making it possible to prevent a short circuit defect due to the electrochemical migration.

Hereinafter, a printed circuit substrate according to a third embodiment of the present invention will be described with reference to FIG. 3. Herein, the printed circuit substrate according to the third embodiment may have the same technical constitution as that according to the aforementioned first embodiment, except for the form of the barrier layer. Therefore, a description of the third embodiment overlapped with that of the first embodiment will be omitted and the same reference numerals will be used for the same technical constitutions.

Figure 3:
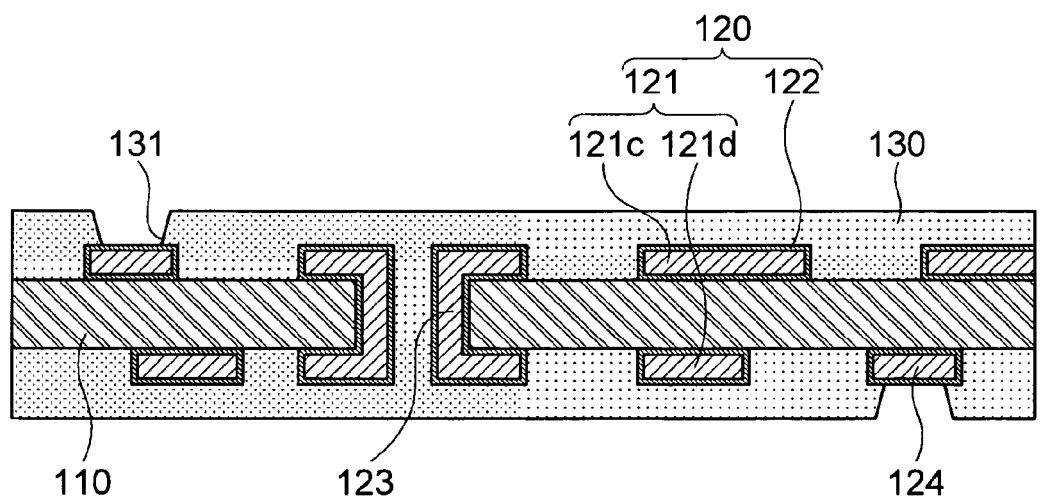
FIG. 3 is a cross-sectional view of a printed circuit substrate according to a third embodiment of the present invention.

FIG. 3 is a cross-sectional view of a printed circuit substrate according to a third embodiment of the present invention.

Referring to FIG. 3, the printed circuit substrate according to the third embodiment of the present invention may include a circuit layer 120 that is disposed on a first insulating layer 110. Herein, the circuit layer 120 may include a circuit pattern 121 and a barrier layer 122 that is disposed on one surface of the circuit pattern 121.

The barrier layer 122 may further be interposed between the first insulating layer 110 and the circuit pattern 121. That is, the barrier layer 122 may be formed to cover all surfaces of the circuit pattern 121. Herein, the barrier layer 122 can prevent conductive filaments from growing downward the circuit pattern 121, thereby making it possible to prevent a short circuit defect between third and fourth circuit patterns 121c and 121d that are disposed on the upper and lower portions, respectively. Therefore, although the thickness of the first insulating layer 110 that is interposed between the third and fourth circuit patterns 121c and 121d is reduced, a short circuit defect between the third and fourth circuit patterns 121c and 121d due to the electrochemical migration can be prevented.

In addition, when the printed circuit substrate is a multi-layer printed circuit substrate further including second insulating layers 130 and circuit layers stacked in plural on the first insulating layer 110 including the circuit layer 120, it further includes a barrier layer between the lower portion of the second insulating layer and the stacked circuit layer, thereby making it possible to prevent a short circuit defect due to the interlayer electrochemical migration.

Therefore, the thickness of the second insulating layer 130 to be stacked as well as that of the first insulating layer 110 can be reduced and subsequently, the thickness of the multi-layer printed circuit substrate can be reduced.

Therefore, as shown in the third embodiment of the present invention, the barrier layer is further interposed between the insulating layer and the circuit pattern, thereby making it possible to reduce the thickness of the printed circuit substrate simultaneously with preventing a short circuit defect between the stacked circuit patterns due to the electrochemical migration.

Hereinafter, a method of manufacturing a printed circuit substrate according to a fourth embodiment of the present invention will be described with reference to FIGS. 4 to 7.

FIGS. 4 to 7 are cross-sectional views explaining a method of manufacturing a printed circuit substrate according to a fourth embodiment of the present invention.

Figure 4:
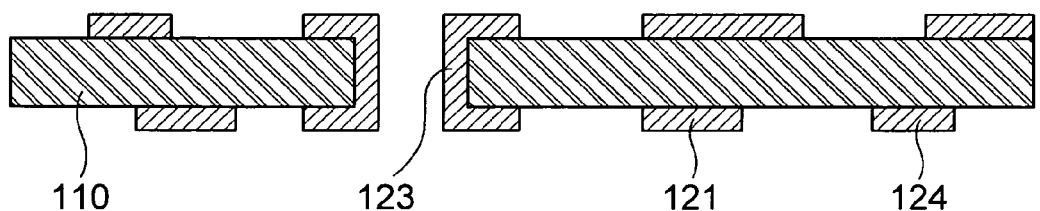
FIGS. 4 to 7 are cross-sectional views explaining a method of manufacturing a printed circuit substrate according to a fourth embodiment of the present invention.

Referring to FIG. 4, in order to manufacture the printed circuit substrate according to the fourth embodiment of the present invention, a circuit pattern 121 constituting circuit layers 120 electrically connected to each other through a via 123 is first formed on both surfaces of a first insulating layer 110.

Herein, the circuit pattern 121 may be formed by, for example, an additive process, a semi additive process, a subtractive process, and the like. The method of manufacturing the circuit pattern is not limited in the embodiment of the present invention.

Herein, pads 124 that are electrically connected to external circuit units, respectively, may further be formed on both surfaces of the first insulating layer 110.

Figure 5:
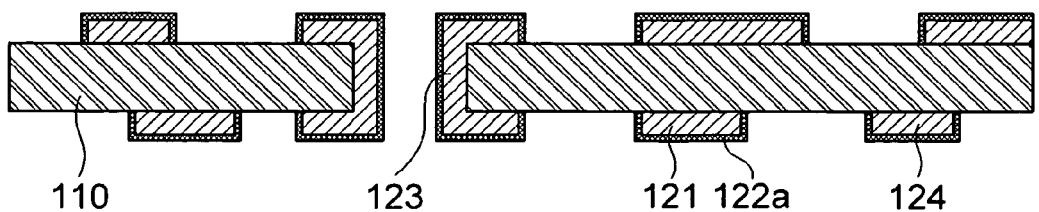

Referring to FIG. 5, after the circuit pattern 121 is formed, an auxiliary barrier layer 122a that covers at least one surface of the circuit pattern 121 is formed. For example, the auxiliary barrier layer 122a may be formed to cover the circuit pattern 121 formed on the first insulating layer 110 or be formed on the side surfaces of the circuit pattern 121, opposite to each other.

The auxiliary barrier layer 122a may be made of metal different from that forming the circuit pattern 121. At this time, the auxiliary barrier layer 122a may be made of a metal material that can form an inter-metallic compound by reacting with the metal forming the circuit pattern 121.

The auxiliary barrier layer 122a may be formed by, for example, a plating method, an inkjet printing method, and a deposition method.

Figure 6:
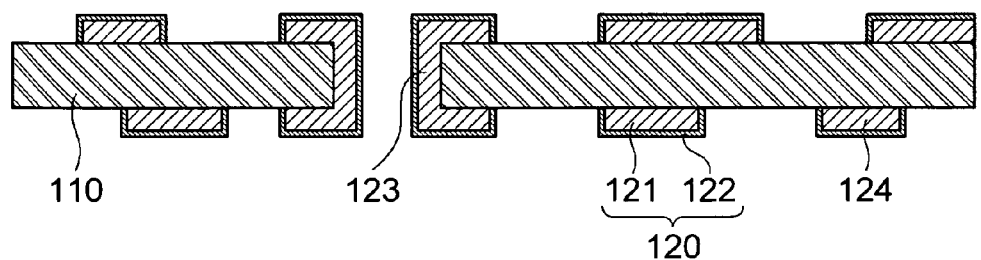

Referring to FIG. 6, after the auxiliary barrier layer 122a is formed, the circuit pattern 121 and the auxiliary barrier layer 122a are annealed to react the metal forming the circuit pattern 121 with the metal forming the auxiliary barrier layer 122a, thereby forming the barrier layer 122.

Herein, the annealing temperature may be in the range of 50° C. to 350° C. This is the reason that when the annealing temperature is below 50° C., it is difficult to form the inter-metallic compound forming the barrier layer 122, whereas when the annealing temperature exceeds 350° C., materials forming the printed circuit substrate, for example, the first insulating layer 110, the second insulating layer 130, the circuit pattern 121, and the like, are deteriorated.

In addition, in order to form the barrier layer 122, the annealing is performed until the metal forming the auxiliary barrier layer 122a is changed into the inter-metallic compound. In other words, the barrier layer 122 may be made of only the inter-metallic compound. This reason is that when the barrier layer 122 is made of the inter-metallic compound, it can function as a barrier to suppress electrochemical migration from the surface of the circuit pattern 121.

In the embodiment of the present invention, the barrier layer 122 is described to be made of the inter-metallic compound by reacting the metal forming the circuit pattern 121 with the metal forming the auxiliary barrier layer 122a, but it is not limited thereto. For example, the barrier layer 122 may be formed by sequentially forming first and second auxiliary barrier layers so as to cover the circuit pattern and then annealing the first and second auxiliary barrier layers. At this time, the first and second auxiliary barrier layers may be made of different metals, for example, metals that can be changed into an inter-metallic compound by reacting with each other.

Therefore, the barrier layer 122 is made of the inter-metallic compound, for example, Cu—Sn, Cu—Zn, Cu—Sb, Cu—In, Ni—B, Ni—Sn, Ag—Sn and the like, by annealing different metals, thereby making it possible to function as a barrier to suppress the electrochemical migration from the surface of the circuit pattern 121.

Figure 7:
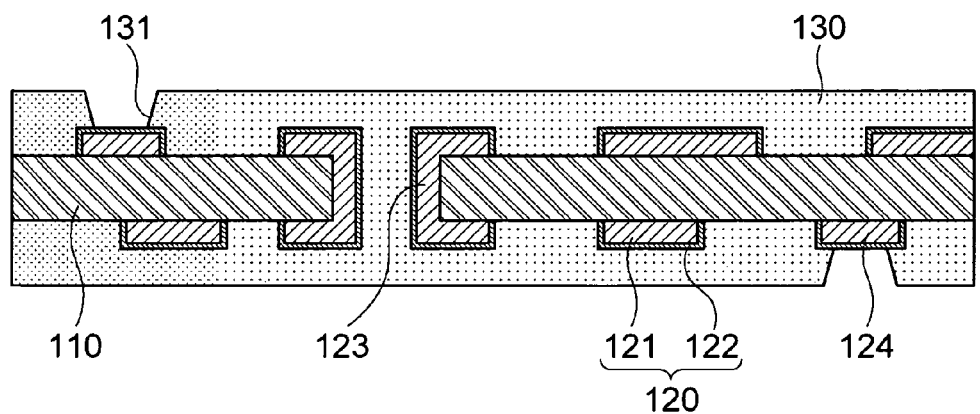

Referring to FIG. 7, after the barrier layer 122 is formed, a second insulating layer 130 is formed on the first insulating layer 110 including the barrier layer 122. The second insulating layer 130 may be made of a solder resist. Herein, the second insulating layer 130 may further include an opening 131 that exposes the pad being connected to the outside.

In the embodiment of the present invention, the printed circuit substrate is described to be formed as a double-sided printed circuit substrate but it is not limited thereto. For example, the printed circuit substrate may be formed as a multi-layer printed circuit substrate by further performing a build-up process before the process for forming the solder resist. At this time, the second insulating layer 130 may use a general insulating resin that can be used in the build-up process but the embodiment of the present invention is not limited thereto.

Further, although the barrier layer is described to be formed on only the circuit pattern, it is not limited thereto but may be formed on at least one surface of the pad.

Hereinafter, a method of manufacturing a printed circuit substrate according to a fifth embodiment of the present invention will be described with reference to FIGS. 8 to 11.

FIGS. 8 to 11 are cross-sectional views explaining a method of manufacturing a printed circuit substrate according to a fifth embodiment of the present invention.

Figure 8:
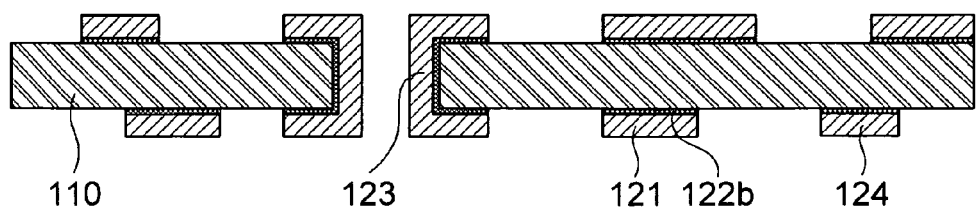
FIGS. 8 to 11 are cross-sectional views explaining a method of manufacturing a printed circuit substrate according to a fifth embodiment of the present invention.

Referring to FIG. 8, in order to manufacture the printed circuit substrate according to the fifth embodiment of the present invention, a first auxiliary barrier layer 122b and a circuit pattern 121 disposed on the first auxiliary barrier layer 122b are first formed on the both surfaces of a first insulating layer 110. At this time, a pad 124 that is electrically connected to the circuit pattern 121 may further be foamed.

Herein, the first auxiliary barrier layer 122b and the circuit pattern 121 may be made of different metals that can form an inter-metallic compound.

The first auxiliary barrier layer 122b may be formed by an inkjet printing method or a deposition method. After the first auxiliary barrier layer 122b is formed, a circuit pattern 121 may be formed on the first auxiliary barrier layer 122b. Herein, the circuit pattern 121 may be formed by, for example, an additive process, a semi additive process, a subtractive process, and the like.

Herein, the first auxiliary barrier layer 122b and the circuit pattern 121 are described to be sequentially formed but the embodiment of the present invention is not limited thereto. For example, after metal layers forming the first auxiliary barrier layer 122b and the circuit pattern 121 are sequentially formed, the first auxiliary barrier layer 122b and the circuit pattern 121 may be simultaneously formed by an etching process.

Figure 9:
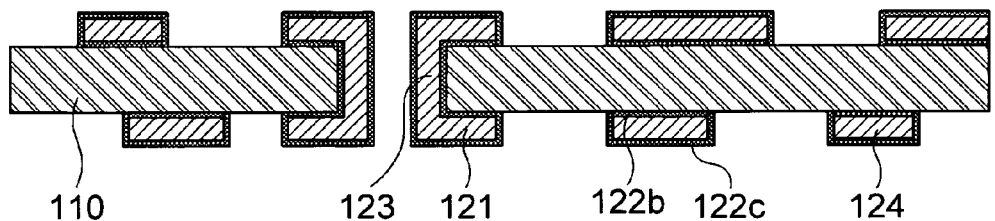

Referring to FIG. 9, after the circuit pattern 121 is formed, a second auxiliary barrier layer 122c that covers the circuit pattern 121 is formed. Herein, the second auxiliary barrier layer 122c may be made of the same metal as the first auxiliary barrier layer 122b. The second auxiliary barrier layer 122c may be formed by, for example, a plating method, an inkjet printing method and a deposition method.

Figure 10:
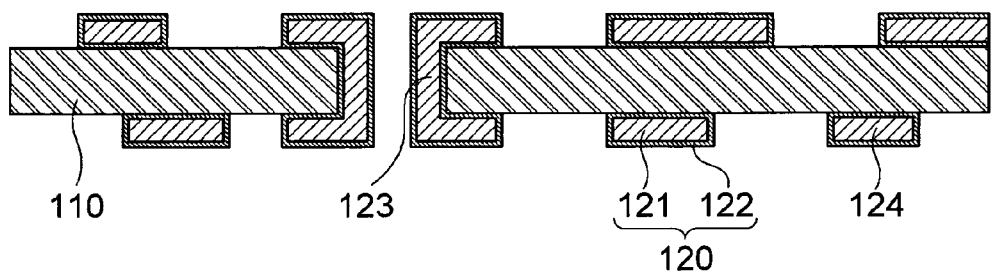

Referring to FIG. 10, after the second barrier layer 122c is formed, the first and second auxiliary barrier layers 122b and 122c and the circuit pattern 121 are annealed, thereby making it possible to form the barrier layer that covers the circuit pattern 121. In other words, the barrier layer 122 may further be interposed between the first insulating layer 110 and the circuit pattern 121.

Therefore, the barrier layer 122 can prevent an electrical short circuit between the circuit patterns disposed in the direction that the circuit layers are stacked due to the electrochemical migration.

Figure 11:
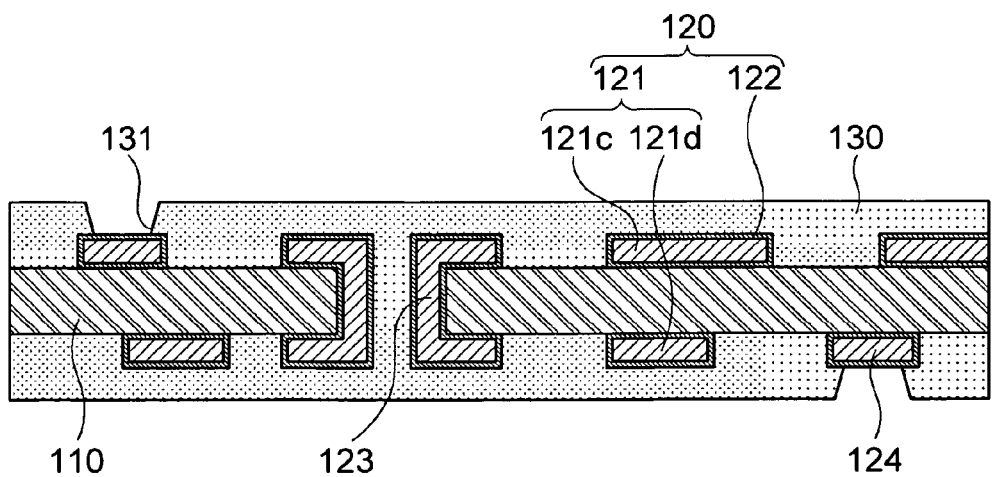

Referring to FIG. 11, after the barrier layer 122 is formed, a second insulating layer 130 is formed on the first insulating layer 110 including the barrier layer 122. Herein, when the printed circuit substrate is a double-sided printed circuit substrate, the second insulating layer 130 may further include an opening 131 that exposes the pad 124 being connected to the outside.

In addition, although the barrier layer 122 is described to be formed only on the circuit pattern 121, it is not limited thereto but may further be formed on at least one surface of the pad 124.

The table below shows a comparison of the results of a highly accelerated stress test (HAST) according to the embodiment of the present invention and the comparative example.

Herein, in the experimental specimen of the comparative example, the first and second circuit patterns having an interval of 10 μm are formed on the insulating substrate. At this time, the first and second circuit patterns are formed to have a width of 10 μm. Further, the first and second circuit patterns are made of copper.

The experimental specimen of the experimental example is manufactured in the same manner as that of the comparative example, except for forming the barrier layer so as to cover the circuit patterns. Herein, the barrier layer is made of Cu—Sn.

TABLE 1

| Test conditions | Lifetime (Short circuit generation time) | |
| --- | --- | --- |
| | Comparative Example | Experimental Example |
| 3.5 V, 130° C., 85% RH | Below 100 hours | Exceeding 100 hours |
| 5 V, 130° C., 85% RH | Below 60 hours | Exceeding 100 hours |
| 12 V, 130° C., 85% RH | Below 50 hours | Exceeding 100 hours |
| 20 V, 130° C., 85% RH | Below 15 hours | Exceeding 100 hours |

As shown in the table, the barrier layer made of the inter-metallic compound is formed on the circuit pattern to function as a barrier to suppress the electrochemical migration from the circuit pattern, thereby making it possible to prevent a short circuit generated between the circuit patterns.

According to the present invention, the printed circuit substrate according to the present invention includes the barrier layer on at least one surface of the circuit pattern, such that it can suppress the electrochemical migration and prevent a short circuit between the circuit patterns, thereby making it possible to secure reliability while achieving high-density.

In addition, according to the present invention, the printed circuit substrate includes the barrier layer on at least one surface of the circuit pattern, such that it can also be used under an extreme environment with high-temperature and high-humidity, thereby making it possible to enhance the selection of use according to the environmental conditions.

In addition, according to the present invention, the printed circuit substrate further includes the barrier on the lower portion of the circuit pattern, such that it can prevent the interlayer short circuit between the printed patterns, thereby making it possible to reduce the thickness of the printed circuit substrate.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A printed circuit substrate, comprising:
   an insulating layer; and
   a circuit layer that includes a circuit pattern disposed on the insulating layer and a barrier layer that is disposed to cover all surfaces of the circuit pattern and suppresses electrochemical migration from the circuit pattern.

2. The printed circuit substrate according to claim 1, wherein the barrier layer is made of an inter-metallic compound.

3. The printed circuit substrate according to claim 2, wherein the inter-metallic compound includes any one of Cu—Sn, Cu—Zn, Cu—Sb, Cu—In, Ni—B, Ni—Sn and Ag—Sn.

4. The printed circuit substrate according to claim 1, comprising a pad that is electrically connected to the circuit layer, the barrier layer further being disposed on all surfaces of the pad.

5. A method of manufacturing a printed circuit substrate, comprising:
   forming a first auxiliary barrier layer on an insulating layer:
   forming a circuit pattern on the first auxiliary barrier layer; and
   forming a second auxiliary barrier layer on all exposed surfaces of the circuit pattern; and forming a barrier layer which covers all surfaces of the circuit pattern, by annealing the first auxiliary barrier layer, the second auxiliary barrier layer, and the circuit pattern.

6. The method of manufacturing the printed circuit substrate according to claim 5, wherein the barrier layer is made of an inter-metallic compound.

7. The method of manufacturing the printed circuit substrate according to claim 5, wherein the barrier layer includes any one of Cu—Sn, Cu—Zn, Cu—Sb, Cu—In, Ni—B, Ni—Sn and Ag—Sn.

* * * * *